(12) United States Patent
Cho et al.

(10) Patent No.: US 6,472,920 B1
(45) Date of Patent: Oct. 29, 2002

(54) HIGH SPEED LATCH CIRCUIT

(75) Inventors: Jung Ho Cho, Basking Ridge; Thaddeus John Gabara, Murray Hill, both of NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/953,779

(22) Filed: Sep. 17, 2001

(51) Int. Cl.[7] .............................................. H03K 31/356
(52) U.S. Cl. ........................................ 327/215; 327/211
(58) Field of Search ............................... 327/52, 55, 57, 327/199–204, 206, 208, 210–215, 218, 219

(56) References Cited

U.S. PATENT DOCUMENTS

| | | | | |
|---|---|---|---|---|
| 4,486,673 A | * | 12/1984 | Koike | 327/210 |
| 4,602,167 A | * | 7/1986 | Yukawa | 327/208 |
| 4,633,098 A | * | 12/1986 | Mahmud | 327/198 |
| 5,821,791 A | * | 10/1998 | Gaibotti et al. | 327/202 |
| 6,310,501 B1 | * | 10/2001 | Yamashita | 327/211 |

* cited by examiner

Primary Examiner—My-Trang Nu Ton
(74) Attorney, Agent, or Firm—Ryan, Mason & Lewis, LLP

(57) ABSTRACT

A latch circuit having reduced propagation delay and set-up and hold times comprises at least one set of cross-coupled transistor devices arranged between an upper supply terminal of the circuit and a lower supply terminal of the circuit. A first input transistor device is coupled in parallel with a first one of the transistor devices of the set of cross-coupled transistor devices, and a second input transistor device is coupled in parallel with a second one of the transistor devices of the set of cross-coupled transistor devices. The first and second input transistor devices are adapted for application of respective uncomplemented and complemented inputs thereto during an initialization mode of the latch circuit. Uncomplemented and complemented output signals are generated at corresponding output terminals associated with the set of cross-coupled transistor devices during an evaluation mode of the latch circuit. The latch circuit may be implemented as a master in a master-slave configuration having additional slave circuitry so as to provide a tradeoff between operating speed and a desired set-up and hold time window.

13 Claims, 5 Drawing Sheets

HIGH SPEED LATCH CIRCUIT

FIELD OF THE INVENTION

The present invention relates generally to latch circuits for use as memory cells or in other data capture applications, and more particularly to techniques for improving the performance of such latch circuits.

BACKGROUND OF THE INVENTION

Latch circuits are commonly used in data capture applications and may be implemented as or in conjunction with conventional data capture elements such as memory cells or flip-flops. There are many different types of latch circuits known in the art. Examples of conventional latch circuits are described in M. Afghani, "A Robust Single Phase Clocking for Low Power, High-Speed VLSI Applications," IEEE Journal of Solid-State Circuits, Vol. 31, No. 2, pp. 247–254, February 1996, S. J. Lovett et al., "Yield and Matching Implications for Static RAM Memory Array Sense-Amplifier Design," IEEE Journal of Solid-State Circuits, Vol. 35, No. 8, pp. 1200–1204, August 2000, and J. -C. Kim et al., "CMOS sense amplifier-based flip-flop with two N-C$^2$MOS output latches," Electronics Letters, Vol. 36, No. 6, pp. 498–500, Mar. 16, 2000, all of which are incorporated by reference herein.

A significant problem with conventional latch circuits such as those described in the above-cited references is excessive propagation delay. For example, a conventional latch circuit configured to operate as a memory cell will generally require an input transmission gate in order to allow data to be introduced into the cell. Such a gate introduces a substantial propagation delay, and thus limits the speed at which the latch circuit can operate.

A related problem is unduly long set-up and hold time requirements. The set-up time refers generally to the period of time that the data must maintain a particular logic level at a latch circuit input prior to clocking, while the hold time refers to the amount of time that the data must remain at the particular level at the circuit input after clocking. The minimum requirements for the set-up and hold times must be satisfied in order for the particular data level to be reliably captured by the latch circuit. Unduly long set-up and hold time requirements therefore further limit the speed at which the latch circuit can operate.

The propagation delay problem and related set-up and hold time problem are typically attributable to excessive parasitic capacitance in the latch circuit. Such parasitic capacitance may be a function of the layout of the circuit, e.g., the manner in which the latch circuit is configured to accommodate requirements such as the above-noted input transmission gate.

In view of the foregoing, it is apparent that a need exists for an improved latch circuit that exhibits reduced propagation delay and set-up and hold time requirements, and thus a higher speed of operation.

SUMMARY OF THE INVENTION

The present invention meets the above-identified need by providing improved latch circuits that can operate with lower propagation delay and set-up and hold time requirements, and thus at a higher speed, than the conventional circuits mentioned above.

In accordance with one aspect of the invention, a latch circuit comprises at least one set of cross-coupled transistor devices arranged between an upper supply terminal of the circuit and a lower supply terminal of the circuit. In addition, a first input transistor device is coupled in parallel with a first one of the transistor devices of the set of cross-coupled transistor devices, and a second input transistor device is coupled in parallel with a second one of the transistor devices of the set of cross-coupled transistor devices. The first and second input transistor devices are adapted for application of respective uncomplemented and complemented inputs thereto during an initialization mode of the latch circuit. Uncomplemented and complemented output signals are generated at corresponding output terminals associated with the set of cross-coupled transistor devices during an evaluation mode of the latch circuit.

In accordance with another aspect of the invention, the latch circuit may be implemented as a master in a master-slave configuration having additional slave circuitry so as to provide a tradeoff between operating speed and a desired set-up and hold time window.

As noted previously, a latch circuit in accordance with the invention generally exhibits reduced propagation delay and set-up and hold times relative to conventional circuits. Another significant advantage of a latch circuit in accordance with the invention is that such a circuit can be configured to exhibit an improved power supply rejection ratio (PSRR), and thus can detect smaller input voltages than would otherwise be possible using conventional circuits.

DETAILED DESCRIPTION OF THE INVENTION

The present invention will be illustrated herein using exemplary latch circuits configured to operate as random access memory (RAM) cells or other types of memory cells. It should be understood, however, that the invention is more generally suitable for use in any latch circuit application in which it is desirable to provide improved performance in terms of at least one of operating speed and power supply rejection ratio (PSRR). The term "latch circuit" as used herein is intended to include a memory cell, flip-flop, or any other type of circuit or circuit element capable of capturing data. In the illustrative embodiments, supply voltage Vss is illustrated as ground potential, but can be a particular non-zero voltage level, as is well known. Also, those skilled in the art will recognize that the polarity of the transistor devices in a given circuit generally may be reversed, e.g., p-channel devices may be replaced with n-channel devices and vice versa. Moreover, the described circuits can be implemented using other transistor technologies, such as bipolar junction transistors (BJTs), GaAs transistors, and other technologies, as well as combinations thereof.

Figure 1A:
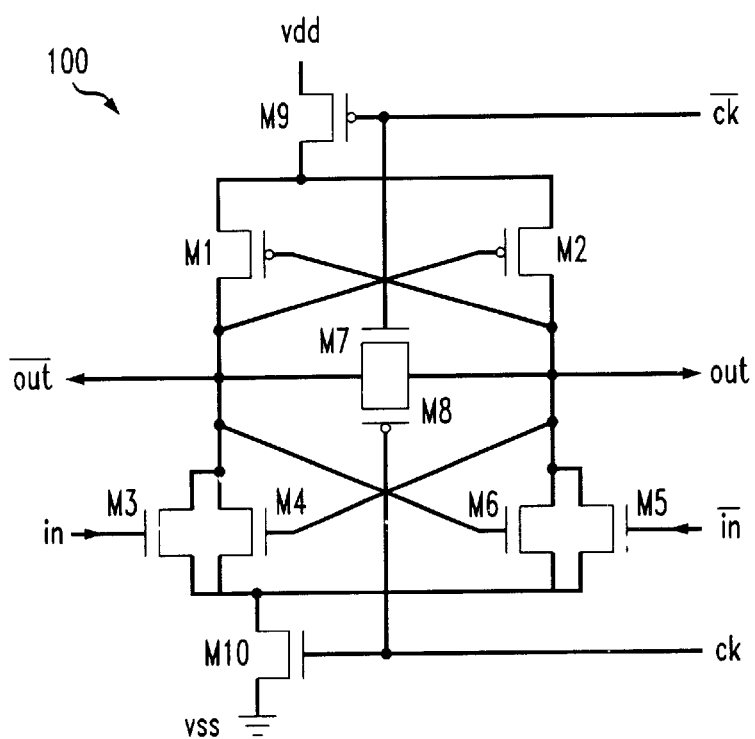
FIGS. 1A, 2, 3, 4, 5 and 6 are schematic diagrams of example high speed latch circuits in accordance with illustrative embodiments of the present invention.

FIG. 1A shows a latch circuit 100 in accordance with a first illustrative embodiment of the present invention. As indicated above, the latch circuit 100 and other illustrative latch circuits to be described herein are configured to operate as memory cells, but it should be emphasized that this is by way of example and not limitation.

The circuit 100 includes p-channel metal-oxide-semiconductor (PMOS) devices M1, M2, M8 and M9, and n-channel MOS (NMOS) devices M3, M4, M5, M6, M7 and M10, all arranged as shown. In this embodiment, device M1 is cross-coupled with device M2, and device M4 is cross-coupled with device M6. More particularly, a gate terminal of device M1 is coupled to a drain terminal of device M2, and a drain terminal of device M1 is coupled to a gate terminal of device M2, while a gate terminal of device M4 is coupled to a drain terminal of device M6, and a drain terminal of device M4 is coupled to a gate terminal of device M6.

A source terminal of M9 is coupled to an upper supply voltage Vdd and a source terminal of M10 is coupled to a lower voltage supply Vss. Vss is illustrated as ground potential in the example circuits described herein. An input signal in is applied to a gate of M3 and its complement in-bar is applied to a gate of M5. Device M3 is connected in parallel at its source and drain terminals with corresponding terminals of device M4, and device M5 is connected in parallel at its source and drain terminals with corresponding terminals of device M6. Device M10 has its drain terminal coupled to a common source terminal of devices M3, M4, M5 and M6.

Device M7 is connected in parallel at its source and drain terminals with corresponding terminals of device M8. A clock signal ck is applied to gate terminals of devices M8 and M10, and its complement ck-bar is applied to gate terminals of devices M7 and M9.

The circuit 100 has output terminals denoted out and out-bar. The out terminal corresponds to the common point of interconnection of the device M2 with the parallel-connected devices M5 and M6. The out-bar terminal corresponds to the common point of interconnection of the device M1 with the parallel-connected devices M3 and M4.

Figure 1B:
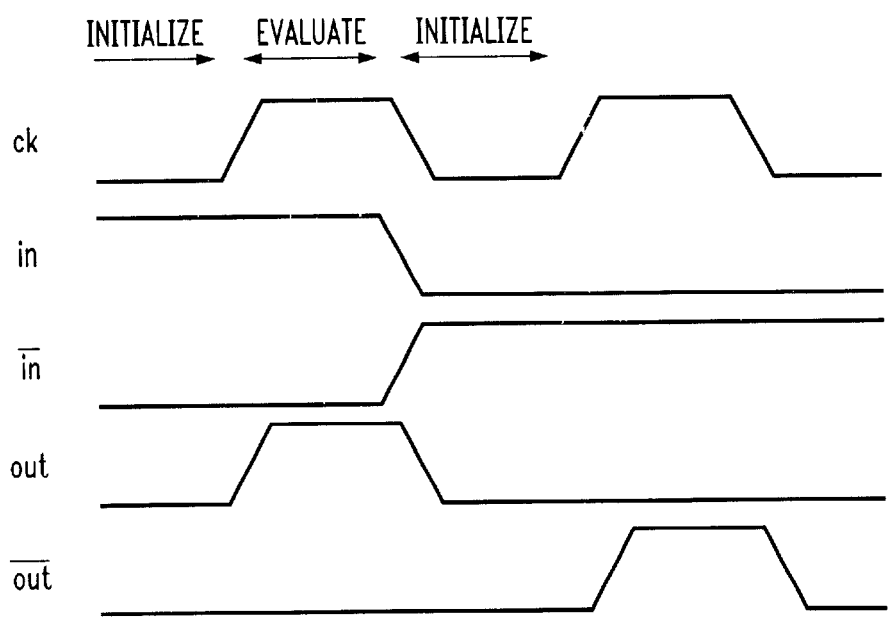
FIG. 1B is a timing diagram for the FIG. 1A circuit.

FIG. 1B is a timing diagram illustrating the operation of the circuit 100. In general, the circuit 100 operates in either an initialization mode or an evaluation mode, depending on the logic level of the clock signal ck.

When clock signal ck is at a logic low level, the circuit 100 is in the initialization mode, the devices M9 and M10 are turned off, and the devices M7 and M8 are turned on. This initializes the out and out-bar terminals. During this mode, the input signals in and in-bar applied to the gate terminals of M3 and M5, respectively, initialize the memory cell. For example, if the input signal in is at a logic high level during a first initialization as indicated in FIG. 1B, the circuit 100 is initialized to this level.

Then, during the immediately following evaluation, which is entered when ck transitions to a logic high level, the devices M9 and M10 are turned on, the devices M7 and M8 are turned off, and the output terminal out goes to the previously-initialized logic high value of in as shown in FIG. 1B. Similarly, when the ck signal again transitions to a logic low level, triggering the next initialization, the output terminal out returns to a logic low level. If in has since transitioned to a logic low level as shown in FIG. 1B, the circuit 100 is initialized to the logic low level, and the output terminal out will remain at the logic low level during the next evaluation.

It should be noted that the particular logic levels and other characteristics of the signals illustrated and described in conjunction with the timing diagram of FIG. 1B and elsewhere herein are by way of example only, and are not requirements or limitations of the invention. Those skilled in the art can readily configure alternative embodiments utilizing signals having different logic levels than those of the described examples.

An advantage of the circuit 100 relative to conventional latch circuits is that the circuit 100, by virtue of the use of devices M3 and M5 to introduce the respective input signals in and in-bar into the circuit, exhibits substantially lower set-up and hold times, and lower propagation delay, than a conventional latch circuit. The particular embodiment shown in FIG. 1A also has the additional advantage of being a low power implementation. A possible disadvantage is that the out and out-bar values established during a given initialization can be overwritten by subsequent application of inputs in and in-bar different than those used in the given initialization.

Another significant advantage of the circuit 100 and other latch circuits to be described herein is that such circuits exhibit an improved power supply rejection ratio (PSRR), and thus can detect smaller input voltages than would otherwise be possible using conventional circuits.

Additional illustrative embodiments of a latch circuit in accordance with the invention will be described in conjunction with FIGS. 2 through 6. Each of these circuits operates in accordance with a timing diagram similar to that described in conjunction with FIG. 1B. Separate timing diagrams will therefore not be shown for the latch circuits of FIGS. 2 through 6.

Figure 2:
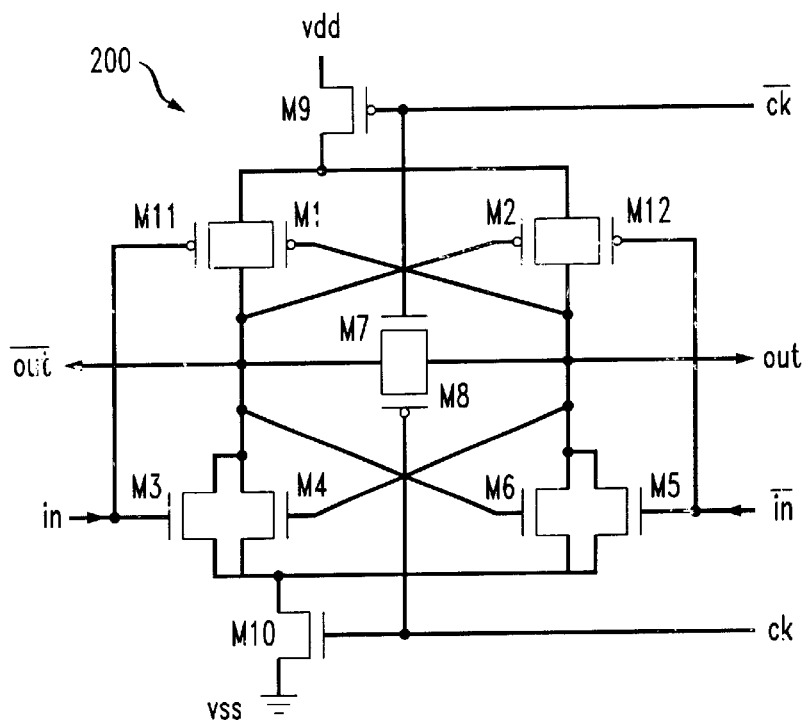

FIG. 2 shows a latch circuit 200 which includes devices M1 through M10 arranged substantially as described above in conjunction with FIG. 1A, along with two additional PMOS devices M11 and M12. Device M11 is connected in parallel at its source and drain terminals with corresponding terminals of device M1, and device M12 is connected in parallel at its source and drain terminals with corresponding terminals of device M2. The input signals in and in-bar are applied to respective gate terminals of the devices M11 and M12, as well as to respective gate terminals of the devices M3 and M5 as in circuit 100 of FIG. 1A.

Advantageously, the circuit 200 of FIG. 2 exhibits a faster evaluation time than the circuit 100 of FIG. 1A, and thus lower set-up and hold times and propagation delay. It also maintains the low power advantages of the circuit 100. In addition, like the circuit 100, the circuit 200 can be overwritten in the manner described above.

Figure 3:
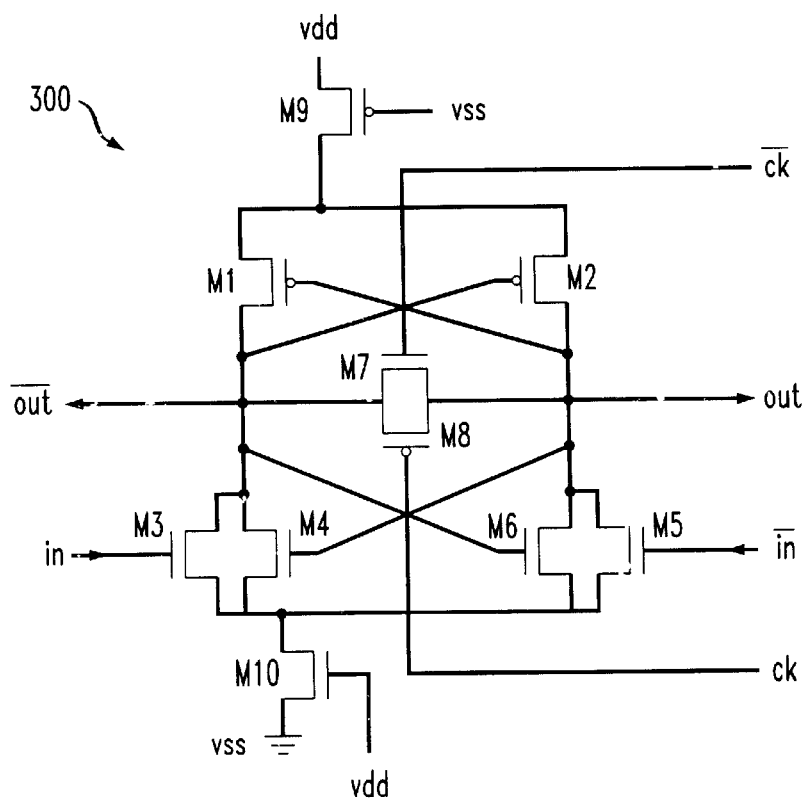

FIG. 3 shows a latch circuit 300 which includes devices M1 through M10 arranged substantially as described above in conjunction with FIG. 1A. However, in the circuit 300, the gate terminal of the PMOS device M9 is tied to the Vss supply, and the gate terminal of the NMOS device M10 is tied to the Vdd supply, such that the devices M9 and M10 are continuously in an on state. Clocking of the devices M9 and M10 is thus eliminated in the FIG. 3 embodiment, such that the speed of operation is improved but power consumption is increased, relative to the circuit 100. The operation of the circuit 300 is otherwise substantially the same as that of the circuit 100.

Figure 4:
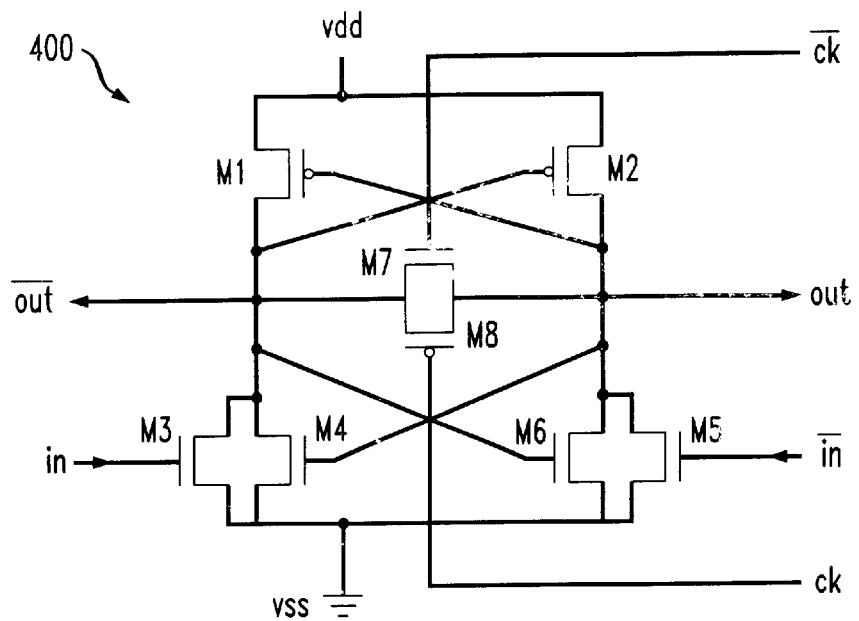

FIG. 4 shows a latch circuit 400 which includes devices M1 through M8 arranged substantially as described above in conjunction with FIG. 1A. In this circuit, the devices M9 and M10 are eliminated and replaced with short circuits to Vdd and Vss, respectively. The performance of the circuit 400 in terms of speed is substantially the same as that of the circuit 300, but the power consumption is increased, while the circuit area requirements and other costs associated with devices M9 and M10 are avoided. The operation of the circuit 400 is otherwise substantially the same as that of the circuit 100.

Figure 5:
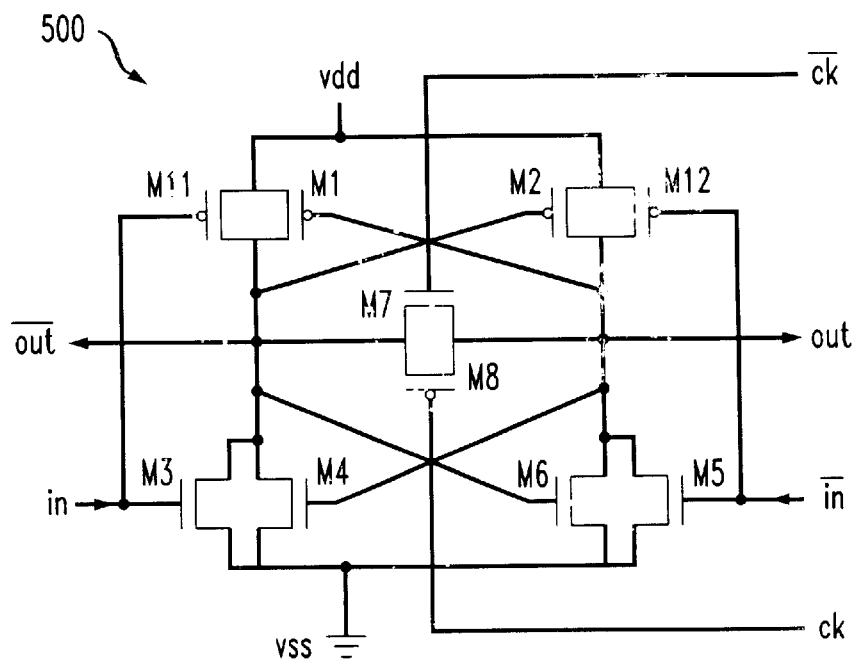

FIG. 5 shows a latch circuit 500 which includes devices M1 through M8, M11 and M12 arranged substantially as described above in conjunction with FIG. 2, but with devices M9 and M10 eliminated as described above in conjunction with FIG. 4. The circuit 500 has a speed performance comparable to that of circuit 200 of FIG. 2, and a power consumption similar to that of the circuit 400 of FIG. 4.

Figure 6:
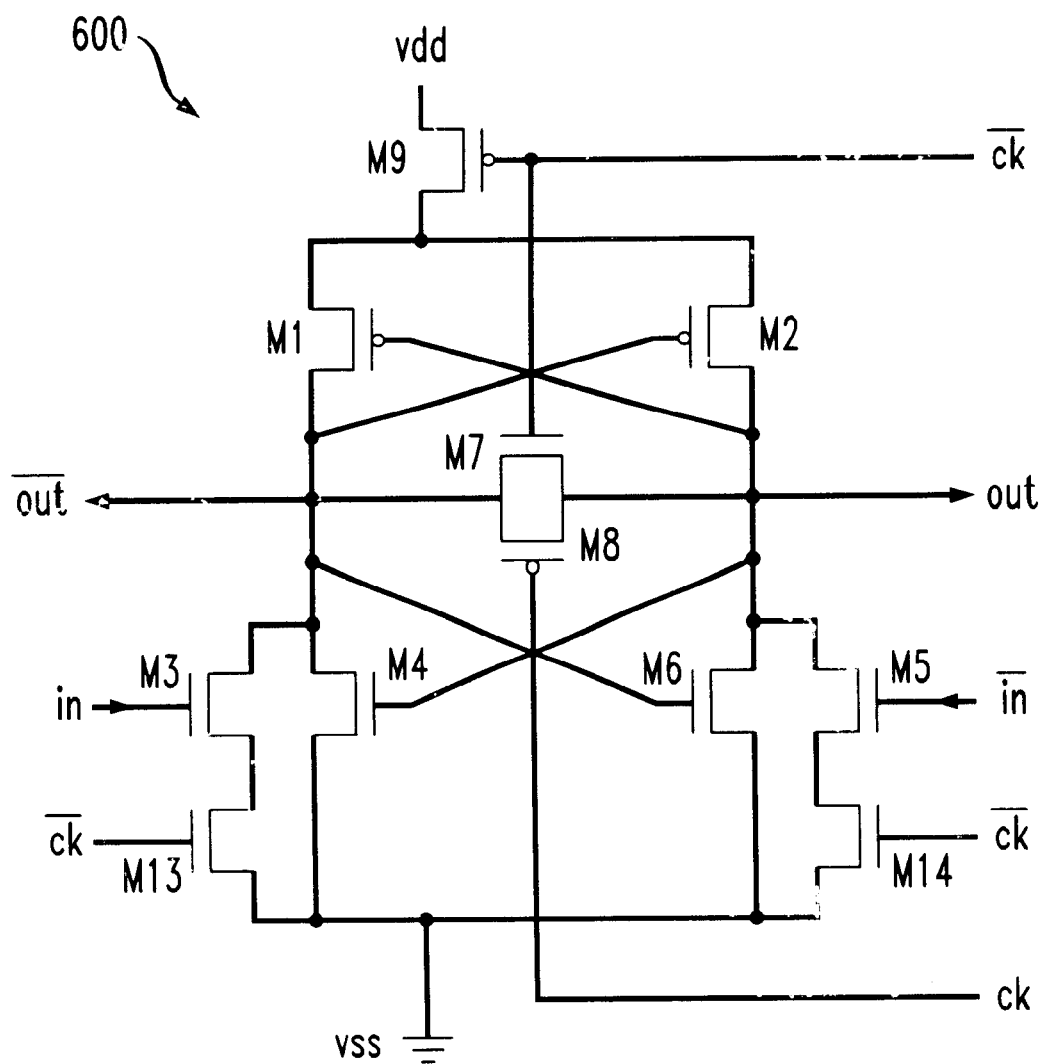

FIG. 6 shows a latch circuit 600 which is configured such that it cannot be overwritten in the manner described above. The circuit 600 thus differs in this respect from the circuits 100, 200, 300, 400 and 500 previously described. The circuit 600 includes devices M1 through M9 configured substantially as described above in conjunction with FIG. 1A. The circuit 600 further includes additional NMOS devices M13 and M14, each arranged in series with one of the devices M3 and M5, and in parallel with one of the devices M4 and M6, as shown in FIG. 6.

The circuit 600 advantageously avoids the above-described situation in which the out and out-bar values established during a given initialization can be overwritten by subsequent application of inputs in and in-bar different than those used in that initialization. More particularly, by application of the complemented clock signal ck-bar to the gate terminals of the devices M13 and M14 as shown in FIG. 6, the impact of the in and in-bar input signals is negated when the clock signal ck is at a logic high level, i.e., during an evaluation mode. As a result, the input signals in and in-bar are able to impact the information stored in the memory cell only during the initialization mode, when the clock signal ck is at a logic low level.

Any of the latch circuits 100 through 600 described above can be utilized in conjunction with other circuitry in a master-slave configuration. In such a configuration, a latch circuit of the type described above can serve as the master, with additional circuitry serving as the slave. Both the master and the slave may be configured to operate as memory cells.

Figure 7:
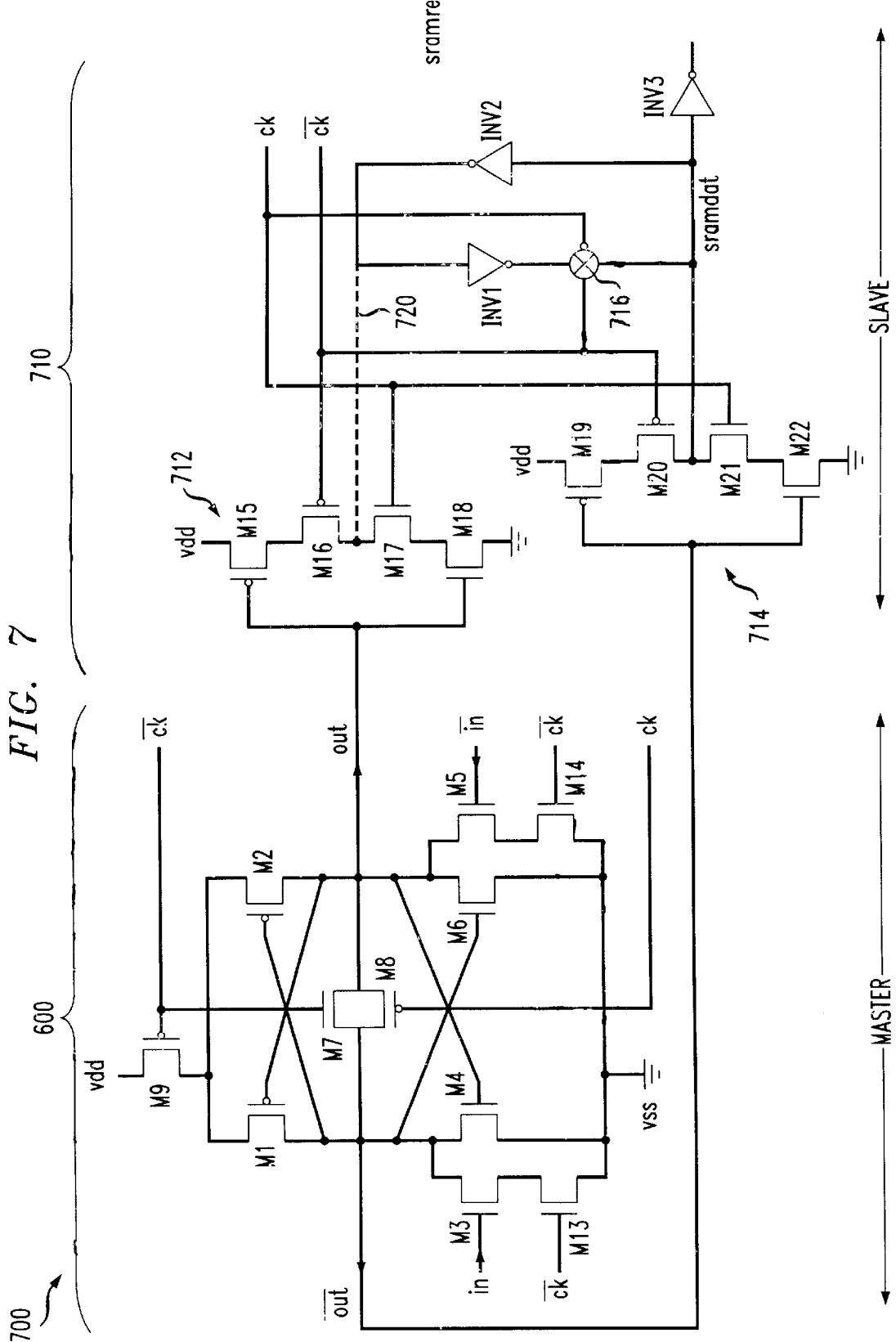
FIG. 7 is a schematic diagram of an example master-slave configuration of a high speed latch circuit in accordance with an illustrative embodiment of the present invention.

FIG. 7 shows an example master-slave configuration of a latch circuit 700 in accordance with an illustrative embodiment of the invention. The circuit 700 includes as a master circuit the latch circuit 600 previously described in conjunction with FIG. 6, and as a slave circuit additional circuitry 710 arranged as shown. The slave circuit 710, like the latch circuit 600, is configured to operate as a memory cell. The slave circuit 710 includes a first clocked inverter 712 with PMOS devices M15 and M16 and NMOS devices M17 and M18, and a second clocked inverter 714 with PMOS devices M19 and M20 and NMOS devices M21 and M22. Gate terminals of the devices M15 and M18 of clocked inverter 712 are coupled to the output terminal out of the circuit 600, and gate terminals of the devices M19 and M22 of clocked inverter 714 are coupled to the output terminal out-bar of the circuit 600.

The slave circuit 710 further includes inverters INV1, INV2 and INV3 and a transmission gate 716. An input of the inverter INV1 is coupled to an output of the inverter INV2, at a node labeled "esramref." An input of the inverter INV2 is coupled to a memory cell data line labeled "sramdat." The sramdat line is also coupled to an output of the clocked inverter 714, to an input of the inverter INV3, and via transmission gate 716 to an output of the inverter INV1. The clock signal ck is applied to gate terminals of NMOS devices M17 and M21, and to a control input of the transmission gate 716. The complemented clock signal ck-bar is applied to gate terminals of the PMOS devices M16 and M20, and to another control input of the transmission gate 716.

The transmission gate 716 may be configured, e.g., as an NMOS device in parallel with a PMOS device, both of which are not shown in the figure. In such a configuration, the clock signal ck is applied to a gate terminal of the PMOS device via the right-side control input of the transmission gate 716, and the complemented clock signal ck-bar is applied to a gate terminal of the NMOS device via the left-side input of the transmission gate 716. As a result, when ck is at a logic low level, the PMOS and NMOS devices are turned on, the transmission gate 716 is enabled, and the output of INV1 is connected to the sramdat line. Similarly, when ck is at a logic high level, the PMOS and NMOS devices are turned off, the transmission gate 716 is disabled, and the output of INV1 is disconnected from the sramdat line.

In operation, the master circuit 600 evaluates the input values, in and in-bar, when the clock signal ck is at a logic high level, in the manner previously described. The clocked inverters 712 and 714 are configured to transfer captured data out of the master memory cell into the slave memory cell when the clock signal ck is at a logic high level. These inverters become tri-stated when ck is at a logic low level, thereby preventing the slave memory cell from responding to the master memory cell. Simultaneously, the slave memory cell becomes enabled, thereby holding the captured data at the sramdat line.

The dashed line in the slave circuit 710 indicates an optional connection 720 that may be made between an output of the clocked inverter 712 and an interconnection point of the INV1 input and INV2 output. When this connection is made, a set-up and hold time window associated with the circuit 700 is moved to the right, i.e., placed later in time in accordance with the signals of the timing diagram of FIG. 1B. If the connection is not made, the speed of the circuit may be increased at the expense of the advantageous positioning of the set-up and hold time window. The connection 720 thus provides an ability to tradeoff circuit speed with a desired set-up and hold time window in the master-slave configuration of circuit 700.

The particular slave circuit 710 utilized in the FIG. 7 embodiment is merely illustrative of the principles of the invention, and other types of slave circuits may be used, as will be apparent to those skilled in the art.

Although the input signals in and in-bar are introduced into the example latch circuits described above through input devices M3 and M5 placed in parallel with the lower cross-coupled devices M4 and M6 of a memory cell configuration, this is by way of example and not limitation. It would also be possible to have input devices M3 and M5 arranged in parallel with the respective upper cross-coupled devices M1 and M2, in a manner similar to the arrangement of devices M11 and M12 in FIG. 2, such that the input signals in and in-bar are introduced into the circuit through devices in parallel with the upper cross-coupled devices.

It should again be emphasized that the particular embodiments of the invention as described herein are intended to be illustrative only. For example, as previously noted, different device types and transistor technologies may be used in other embodiments. In addition, the latch circuits described herein may be implemented in other configurations, i.e., configurations other than memory cells, and can be used in a wide variety of higher level circuit applications. Also, the latch circuits of the present invention may be implemented in the form of an integrated circuit having a plurality of latch circuits and which may or may not include additional circuit components or other processing or memory elements. These and numerous other alternative embodiments within the scope of the following claims will be readily apparent to those skilled in the art.

What is claimed is:

1. A latch circuit comprising:
    at least one set of cross-coupled transistor devices arranged between an upper supply terminal of the circuit and a lower supply terminal of the circuit;
    a first input transistor device coupled in parallel with a first one of the transistor devices of the set of cross-coupled transistor devices; and
    a second input transistor device coupled in parallel with a second one of the transistor devices of the set of cross-coupled transistor devices;
    the first and second input transistor devices being adapted for application of respective uncomplemented and complemented inputs thereto during an initialization mode of the latch circuit;
    at least one output signal being generatable at a corresponding at least one output terminal associated with the at least one set of cross-coupled transistor devices during an evaluation mode of the latch circuit;
    wherein the at least one set of cross-coupled transistor devices comprises an upper set of cross-coupled transistor devices and a lower set of cross-coupled transistor devices, the upper and lower sets being arranged in series between the upper and lower supply terminals, the first and second input transistor devices being coupled in parallel with corresponding first and second transistor devices of the lower set of cross-coupled transistor devices, the latch circuit further including third and fourth input transistor devices coupled in parallel with corresponding first and second transistor devices of the upper set of cross-coupled transistor devices, the first and third input transistor devices each being adapted to receive the uncomplemented input, the second and fourth input transistor devices each being adapted to receive the complemented input.

2. The latch circuit of claim 1 wherein the circuit is configured to operate as a memory cell in which a logic level associated with the inputs is storable.

3. The latch circuit of claim 1 wherein the at least one output terminal comprises an uncomplemented output terminal and a complemented output terminal, each associated with a common terminal of a pair of transistor devices including one transistor device from the upper set of cross-coupled transistor devices and one transistor device from the lower set of cross-coupled transistor devices.

4. The latch circuit of claim 3 wherein the uncomplemented and complemented output terminals of the latch circuit are connectable under control of a clock signal during the initialization mode of the latch circuit.

5. The latch circuit of claim 1 wherein the first and second input transistor devices are each connected in series with an additional transistor device, the combination of the first input transistor and its corresponding additional device being coupled in parallel with the first one of the transistor devices of the lower set of cross-coupled transistor devices, and the combination of the second input transistor and its corresponding additional device being coupled in parallel with the second one of the transistor devices of the lower set of cross-coupled transistor devices, the additional transistor devices each being controllable by a clock signal.

6. The latch circuit of claim 1 wherein the latch circuit comprises a master circuit and further comprising an associated slave circuit.

7. An integrated circuit comprising:
    a plurality of latch circuits, one or more of the latch circuits each comprising:
    at least one set of cross-coupled transistor devices arranged between an upper supply terminal of the circuit and a lower supply terminal of the circuit;
    a first input transistor device coupled in parallel with a first one of the transistor devices of the set of cross-coupled transistor devices; and
    a second input transistor device coupled in parallel with a second one of the transistor devices of the set of cross-coupled transistor devices;
    the first and second input transistor devices being adapted for application of respective uncomplemented and complemented inputs thereto during an initialization mode of the latch circuit;
    at least one output signal being generatable at a corresponding at least one output terminal associated with the at least one set of cross-coupled transistor devices during an evaluation mode of the latch circuit;
    wherein the at least one set of cross-coupled transistor devices comprises an upper set of cross-coupled transistor devices and a lower set of cross-coupled transistor devices, the upper and lower sets being arranged in series between the upper and lower supply terminals, the first and second input transistor devices being coupled in parallel with corresponding first and second transistor devices of the lower set of cross-coupled transistor devices, the latch circuit further including third and fourth input transistor devices coupled in parallel with corresponding first and second transistor devices of the upper set of cross-coupled transistor devices, the first and third input transistor devices each being adapted to receive the uncomplemented input, the second and fourth input transistor devices each being adapted to receive the complemented input.

8. The integrated circuit of claim 7 wherein the circuit is configured to operate as a memory cell in which a logic level associated with the inputs is storable.

9. The integrated circuit of claim 7 wherein the at least one output terminal comprises an uncomplemented output terminal and a complemented output terminal, each associated with a common terminal of a pair of transistor devices including one transistor device from the upper set of cross-coupled transistor devices and one transistor device from the lower set of cross-coupled transistor devices.

10. The integrated circuit of claim 9 wherein the uncomplemented and complemented output terminals of the latch circuit are connectable under control of a clock signal during the initialization mode of the latch circuit.

11. The integrated circuit of claim 7 wherein the first and second input transistor devices are each connected in series with an additional transistor device, the combination of the first input transistor and its corresponding additional device being coupled in parallel with the first one of the transistor devices of the lower set of cross-coupled transistor devices, and the combination of the second input transistor and its corresponding additional device being coupled in parallel with the second one of the transistor devices of the lower set of cross-coupled transistor devices, the additional transistor devices each being controllable by a clock signal.

12. The integrated circuit of claim 7 wherein the latch circuit comprises a master circuit and further comprising an associated slave circuit.

13. A method for use in a latch circuit, the latch circuit comprising at least one set of cross-coupled transistor devices arranged between an upper supply terminal of the circuit and a lower supply terminal of the circuit, a first input transistor device coupled in parallel with a first one of the transistor devices of the set of cross-coupled transistor devices, and a second input transistor device coupled in parallel with a second one of the transistor devices of the set of cross-coupled transistor devices, wherein the at least one set of cross-coupled transistor devices comprises an upper set of cross-coupled transistor devices and a lower set of cross-coupled transistor devices, the upper and lower sets being arranged in series between the upper and lower supply terminals, the first and second input transistor devices being coupled in parallel with corresponding first and second transistor devices of the lower set of cross-coupled transistor devices, the latch circuit further including third and fourth input transistor devices coupled in parallel with corresponding first and second transistor devices of the upper set of cross-coupled transistor devices, the method comprising the steps of:

applying to the first and second input transistor devices respective uncomplemented and complemented inputs, and applying to the third and fourth input transistor devices the respective uncomplemented and complemented inputs, during an initialization mode of the latch circuit; and generating at least one output signal at a corresponding at least one output terminal associated with the at least one set of cross-coupled transistor devices during an evaluation mode of the latch circuit.

\* \* \* \* \*